United States Patent
Olsen et al.

(10) Patent No.: US 7,575,986 B2
(45) Date of Patent: Aug. 18, 2009

(54) GATE INTERFACE RELAXATION ANNEAL METHOD FOR WAFER PROCESSING WITH POST-IMPLANT DYNAMIC SURFACE ANNEALING

(75) Inventors: Christopher Sean Olsen, Fremont, CA (US); Sunderraj Thirupapuliyur, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 11/835,660

(22) Filed: Aug. 8, 2007

(65) Prior Publication Data

US 2009/0042352 A1 Feb. 12, 2009

(51) Int. Cl.
*H01L 21/04* (2006.01)

(52) U.S. Cl. .............. 438/510; 438/308; 257/E21.134; 257/E21.135; 257/E21.267; 257/E21.311; 257/E21.347

(58) Field of Classification Search ................. 438/301, 438/430, 508, 510, 513, 535, 509, 769, 770, 438/775, 954, 308
See application file for complete search history.

(56) References Cited

U.S. PATENT DOCUMENTS

| | | | | |
|---|---|---|---|---|
| 6,632,747 B2 * | 10/2003 | Niimi et al. | ........... | 438/775 |
| 6,649,538 B1 * | 11/2003 | Cheng et al. | ........... | 438/775 |
| 6,780,720 B2 * | 8/2004 | Burnham et al. | ........... | 438/287 |
| 6,987,240 B2 | 1/2006 | Jennings et al. | ........... | 219/121.8 |
| 7,429,540 B2 * | 9/2008 | Olsen | ........... | 438/786 |
| 2002/0197883 A1 * | 12/2002 | Niimi et al. | ........... | 438/775 |
| 2004/0175961 A1 | 9/2004 | Olsen | ........... | 438/786 |
| 2004/0248392 A1 * | 12/2004 | Narwankar et al. | ........... | 438/584 |
| 2006/0178018 A1 | 8/2006 | Olsen | ........... | 438/786 |
| 2007/0202640 A1 * | 8/2007 | Al-Bayati et al. | ........... | 438/184 |

\* cited by examiner

*Primary Examiner*—David Nhu
(74) *Attorney, Agent, or Firm*—Law Office of Robert M. Wallace (57) ABSTRACT

Defects and fixed charge in a gate dielectric near the gate dielectric-substrate interface are reduced by performing a gate dielectric relaxation anneal step prior to source-drain ion implantation, in which the wafer temperature is ramped gradually to near a melting temperature of the substrate equal to a peak post-ion implantation anneal peak temperature. The ramping rates are sufficiently gradual so that the gate dielectric is held above its reflow temperature for a significant duration.

20 Claims, 7 Drawing Sheets

GATE INTERFACE RELAXATION ANNEAL METHOD FOR WAFER PROCESSING WITH POST-IMPLANT DYNAMIC SURFACE ANNEALING

TECHNICAL FIELD

The invention is related to semiconductor device fabrication, and in particular to the formation of a high quality between the gate oxide of a transistor and the underlying crystalline silicon substrate or channel. More specifically, the invention concerns the reduction of defects in the gate dielectric-silicon interface after dynamic surface annealing or millisecond laser annealing of implanted dopants.

BACKGROUND

Carrier mobility in field effect transistors has been hampered by the nature of the interface between the gate dielectric layer and the underlying silicon substrate or channel. As device size has decreased, the need for higher capacitance at the transistor gate has increased. This need has been met by increasing the gate dielectric constant by introducing nitrogen into the gate oxide to form a silicon oxy-nitride compound. This nitridation of the gate dielectric may be carried out as a plasma process, and is followed by a post-nitridation anneal step to stabilize the nitrogen distribution in the gate dielectric. After gate formation, dopant impurities are implanted in source and drain regions adjacent the gate. The implanted dopants are activated in a millisecond laser annealing process in which laser radiation raises the local wafer surface temperature to melting for an extremely short period of time, using temperature ramp rates on the order of a million degrees C. per second. A type of millisecond laser annealing process known as dynamic surface annealing (DSA) is described by Jennings et al. in U.S. Pat. No. 6,987,240, the disclosure of which is incorporated herein by reference in its entirety. In the DSA process, a laser beam combined from an array of CW lasers is scanned across the wafer surface.

One problem is that the carrier mobility in the source-drain channel of the transistor is limited and needs to be improved. It is felt this limitation arises at least in part from the presence of defects or fixed charge in the dielectric at the gate dielectric-silicon channel interface. Measurements of defect density in the gate dielectric-silicon interface indicate a marked increase in defects after millisecond laser annealing or dynamic surface annealing of the implanted dopants forming the source and drain regions. It is a discovery of the present inventors that the carrier mobility-degrading defects become an embedded permanent feature of the gate dielectric-silicon interface because of two aspects of the post-implant dynamic surface anneal step. First, the peak temperature of the dynamic surface anneal process, e.g., 1300 degrees C., is hundreds of degrees above the highest temperature to which the gate dielectric-silicon interface has been subjected during any prior processing step. Secondly, the dynamic surface anneal step ramps up the local surface temperature to the silicon melting temperature and then ramps it back down to ambient at such high ramping rates (e.g., one million degrees C. per second) that there is no opportunity for gate dielectric-silicon interface defects in the gate dielectric to be annealed or cured, but instead are fixed in place ("quenched") upon the rapid temperature ramp-down. The extreme temperature ramp rates of the dynamic surface anneal process cannot be reduced because they are necessary to avoid diffusion of the implanted dopant profile during post-implant anneal. Therefore, there is a need to improve carrier mobility in the transistor source-drain channel by avoiding effects of defects in the gate oxide at the gate dielectric-silicon interface without altering the high ramp rates of the dynamic surface anneal process.

SUMMARY

A method is provided for making a transistor on a semiconductor substrate. The method includes forming a gate dielectric on the semiconductor substrate, forming a gate electrode on the gate dielectric and then ion implanting dopant impurities into the substrate to form source and drain regions. The method further includes performing millisecond laser annealing by scanning a laser-generated light beam across the substrate so as to rapidly raise each region illuminated by the beam to a peak temperature at or near the melting temperature of the material of the semiconductor substrate and then rapidly cool it by conduction to the surrounding material. Prior to the ion implanting to form the source and drain regions, a gate dielectric relaxation annealing step is performed by raising the temperature of the substrate from an ambient temperature to the peak temperature of the millisecond laser annealing at a first rate and decreasing the temperature of the substrate from the peak temperature to an ambient temperature at a second rate, the first and second rates being less than 250 degrees C. per second.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the FIGS. The drawings in the FIGS. are all schematic and not to scale.

DETAILED DESCRIPTION

Figure 1:
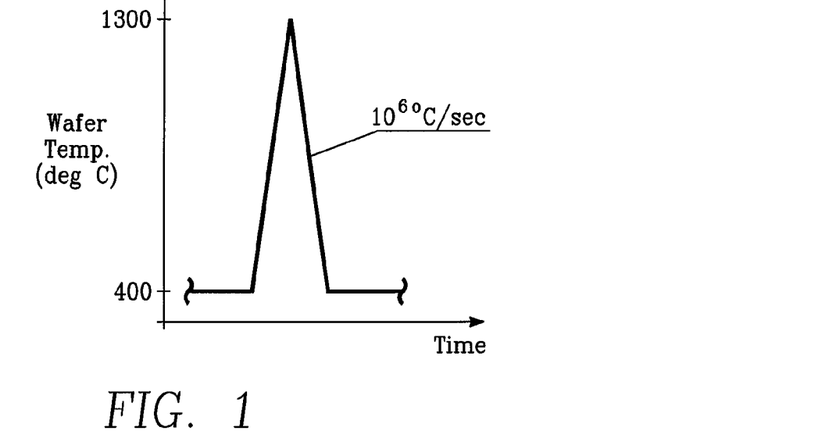
FIG. 1 illustrates a local surface area temperature profile during millisecond laser annealing.

Ultra-shallow semiconductor junctions, for transistors with feature sizes on the order of 45 nm, are fabricated using ion implantation followed by a millisecond laser annealing process such as dynamic surface annealing. Dynamic surface annealing does not disturb the fine definition of the ultra-shallow junctions because it heats a local area of the wafer to the silicon melting temperature at an extremely high ramp rate and then cools it back to the original temperature at an extremely high rate. FIG. 1 is a graph depicting the temperature profile of a single location on the wafer surface about the size of the laser beam. This behavior is achieved using a large array of CW lasers that form a powerful combined beam that is scanned across the wafer surface. As described previously in this specification, such rapid heating and cooling rates tend to fix any oxide defects into place in the gate dielectric-silicon interface, making such defects a permanent feature of the transistors on the wafer.

Figure 2:
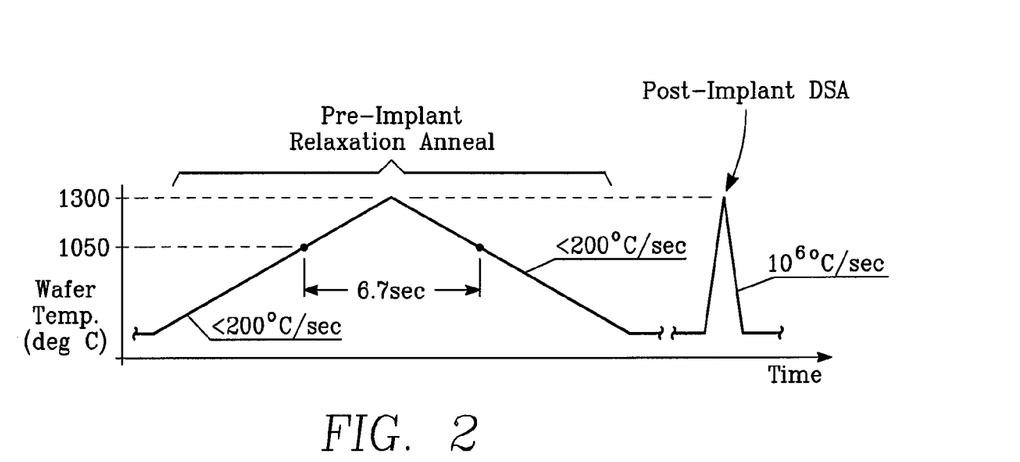
FIG. 2 illustrates a temperature profile in one embodiment of the invention.

FIG. 2 depicts a temperature profile corresponding to one embodiment in which the foregoing problems are solved. During wafer processing prior to ion implantation of dopant impurities or source-drain formation, a pre-implant relaxation anneal step is performed, during which the wafer temperature is slowly ramped up to the silicon melting temperature and then slowly ramped down to the original (e.g., ambient) wafer temperature. The ramp-up and ramp-down rates are both less than 250 degrees C. per second, and may be 75 degrees C. per second, for example. In subsequent process steps (not indicated in the temperature profile of FIG. 2), dopant impurities are ion implanted to form the source and drain regions. Thereafter, the implanted dopants are activated by a post-implant millisecond laser annealing process (e.g., dynamic surface annealing), in which the local temperature on the wafer surface is briefly held at the silicon melting temperature, in accordance with the procedure described with reference to FIG. 1. By performing the pre-implant relaxation anneal step prior to ion implantation of the source-drain regions, the wafer temperature can be elevated above 1050 degrees C. for a long duration without affecting or causing diffusion of ultra-shallow junctions or ion-implanted regions.

In one example of the pre-implant relaxation anneal step, the wafer temperature is above 1050 degrees C. for about 6.7 seconds, where the ramp-up and ramp-down rates are 75 degrees C. per second and the peak temperature 1300 degrees C. Above 1050 degrees C., the silicon oxynitride material of the gate dielectric is viscous and can reflow, allowing some atomic rearrangement to repair many or all of the defects in the dielectric at the gate dielectric-silicon interface. The 6.7 second duration is sufficient to significantly reduce the defect density in the gate dielectric. The resulting reduction in defects in the gate dielectric at the dielectric-silicon interface improves carrier mobility in the source-drain channel. Another feature of the pre-implant relaxation anneal step is that the peak temperature (e.g., 1300 degrees C.) is the same as the peak temperature reached during the later dynamic surface annealing step. It is felt that the fixed charge in the gate dielectric material is a function of the difference between the dynamic surface anneal peak temperature (e.g., 1300 degrees C.) and the previous peak temperature to which the gate dielectric material has been exposed. By bringing this difference to zero, the fixed charge in the gate dielectric material is minimized. The resulting reduction in fixed charge in the gate dielectric near the gate dielectric-silicon interface improves carrier mobility in the source-drain channel.

The pre-implant relaxation anneal step may be performed at nearly any time prior to ion implantation. In a first embodiment, it is performed upon deposition of the polysilicon gate conductor layer. In a second embodiment, it is performed upon reoxidation of the polysilicon gate stack. In a third embodiment, it is performed prior to polysilicon gate deposition as part of a post-nitridation anneal step, as will be described below in greater detail.

Figure 3:
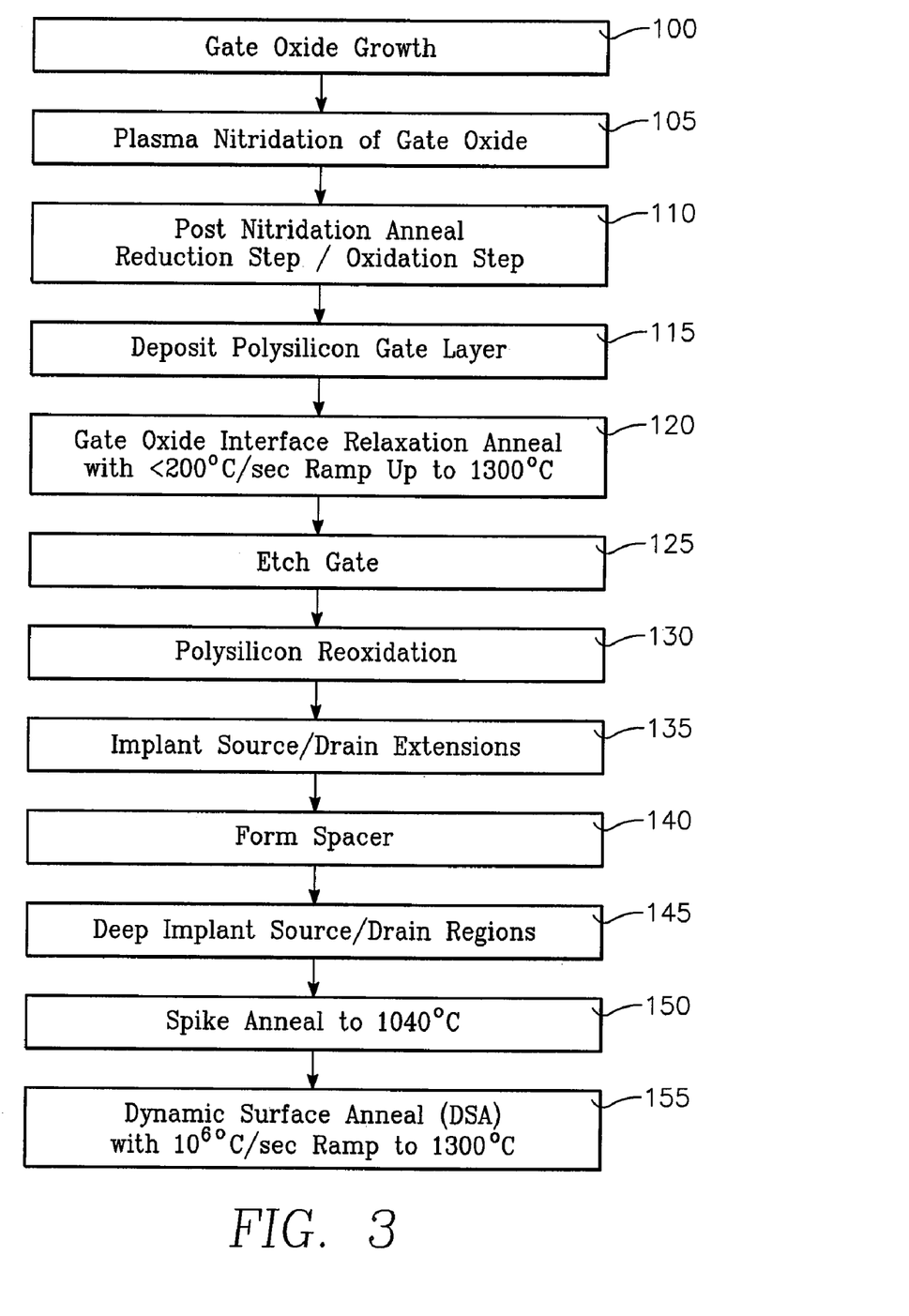
FIG. 3 is a block flow diagram of a process of first embodiment.
Figure 4A:
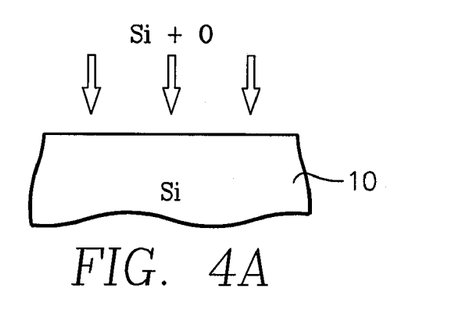
FIGS. 4A through 4H are a chronological sequence of process steps.
Figure 4B:
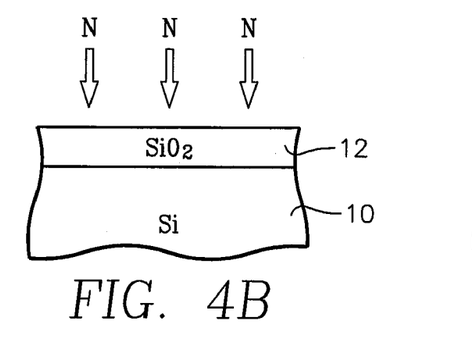
Figure 4C:
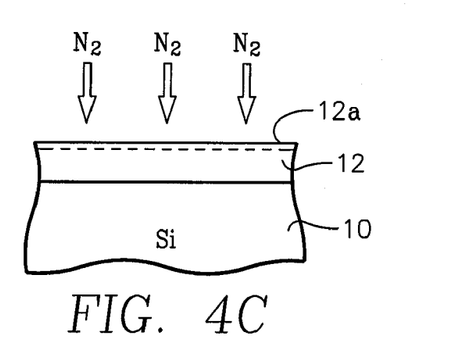
Figure 4D:
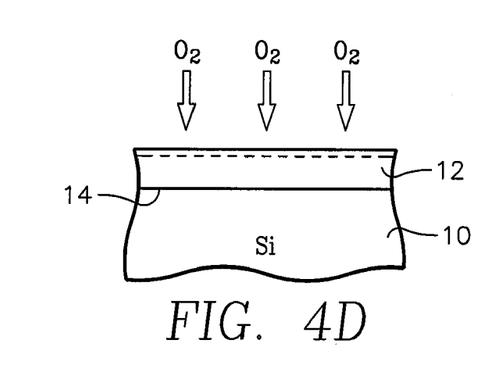

FIG. 3 depicts the process flow sequence of the first embodiment while FIGS. 4A through 4H are a chronological sequence of views of the gate dielectric-silicon interface during device fabrication. In the embodiment of FIG. 3, the gate dielectric relaxation anneal step is performed after deposition of the polysilicon gate layer, as will now be described. The first step is to expose a crystalline silicon wafer 10 of FIG. 4A to a process gas containing a silicon compound (e.g., silane) and oxygen gas (block 100 of FIG. 3). This forms a silicon dioxide layer 12 on the silicon substrate 10, defining an interface 14 between the silicon dioxide layer 12 and the surface of the underlying silicon substrate 10. The interface 14 may be referred to as the gate dielectric-silicon interface. Referring to FIG. 4B, the silicon dioxide layer 12 formed by the step of block 100 of FIG. 4A is exposed to a nitrogen-containing plasma to perform nitridation of the oxide layer 10 (block 105 of FIG. 3). After plasma nitridation, the N in the SiO2 is metastable and will decrease while waiting to receive the polysilicon electrode step. The nitrogen distribution in the gate dielectric 12 is stabilized by a post-nitridation anneal step (block 110 of FIG. 3). At this point, the gate dielectric 12 is a silicon oxynitride material. Referring to FIGS. 4C and 4D, the post-nitridation step in one implementation may consist of multiple steps, in which the wafer is exposed to a reducing atmosphere (FIG. 4C) while being heated to about 1000 degrees C., which can densify the silicon oxynitride gate dielectric 12. In the second of the two post nitridation annealing steps, which is depicted in FIG. 4D, the wafer is heated in an oxidizing atmosphere in order to grow silicon dioxide near the gate dielectric-silicon interface 14 between the crystalline silicon 10 and the gate dielectric 12. Such a multiple step post-nitridation anneal process is discussed below in greater detail with reference to the third embodiment.

Figure 4E:
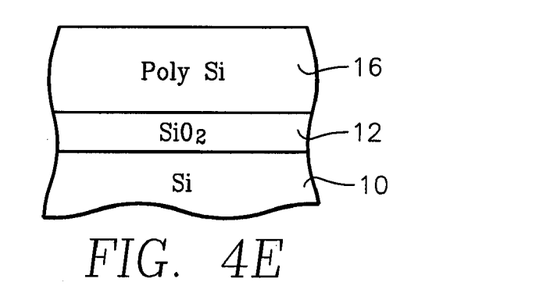

The next step is to deposit a polysilicon layer 16 shown in FIG. 4E, which is the step of block 115 of FIG. 3. Following this step, a pre-implant gate oxide relaxation anneal step is performed (block 120 of FIG. 3). In this step, the wafer temperature is slowly ramped up from a low temperature (e.g., 400 degrees C.) to the silicon melting temperature (1300 degrees C.) and then ramped down to the starting temperature. The ramp rate (both up and down) may be about 75 degrees C. per second, or more generally below about 250 degrees C. per second. The temperature profile during this step follows the portion of the graph of FIG. 2 labeled "preimplant relaxation anneal".

Figure 4F:
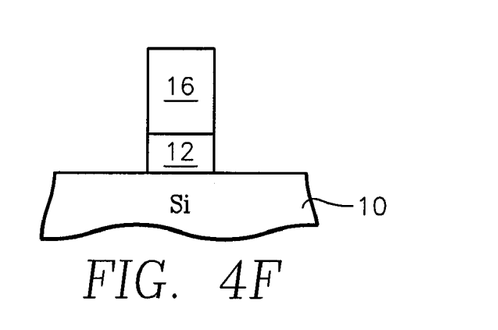
Figure 4G:
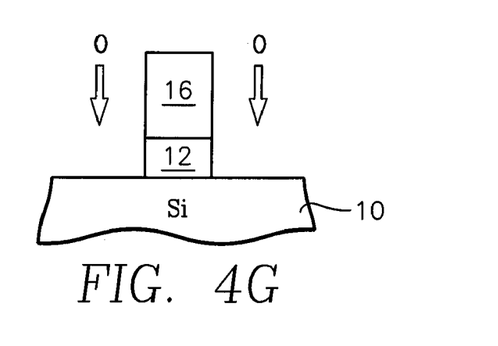

Gate stack fabrication is then completed by performance of a gate etch step (block 125 of FIG. 3) depicted in FIG. 4F and a polysilicon reoxidation step (block 130 of FIG. 3) depicted in FIG. 4G, in which the gate stack 10, 12, 16 is exposed to an oxidizing atmosphere. Damaged or undercut portions of the gate 16 are consumed by oxidation during this step. Device fabrication is completed by ion implanting the source-drain extensions 30 of FIG. 4H (block 135 of FIG. 3), formation of the spacer 32 of FIG. 4H (block 140 of FIG. 3), ion implantation of the deep source and drain regions 34, 36 (block 145 of FIG. 3), spike anneal (block 150) followed by millisecond laser anneal or dynamic surface anneal (block 155).

Figure 5:
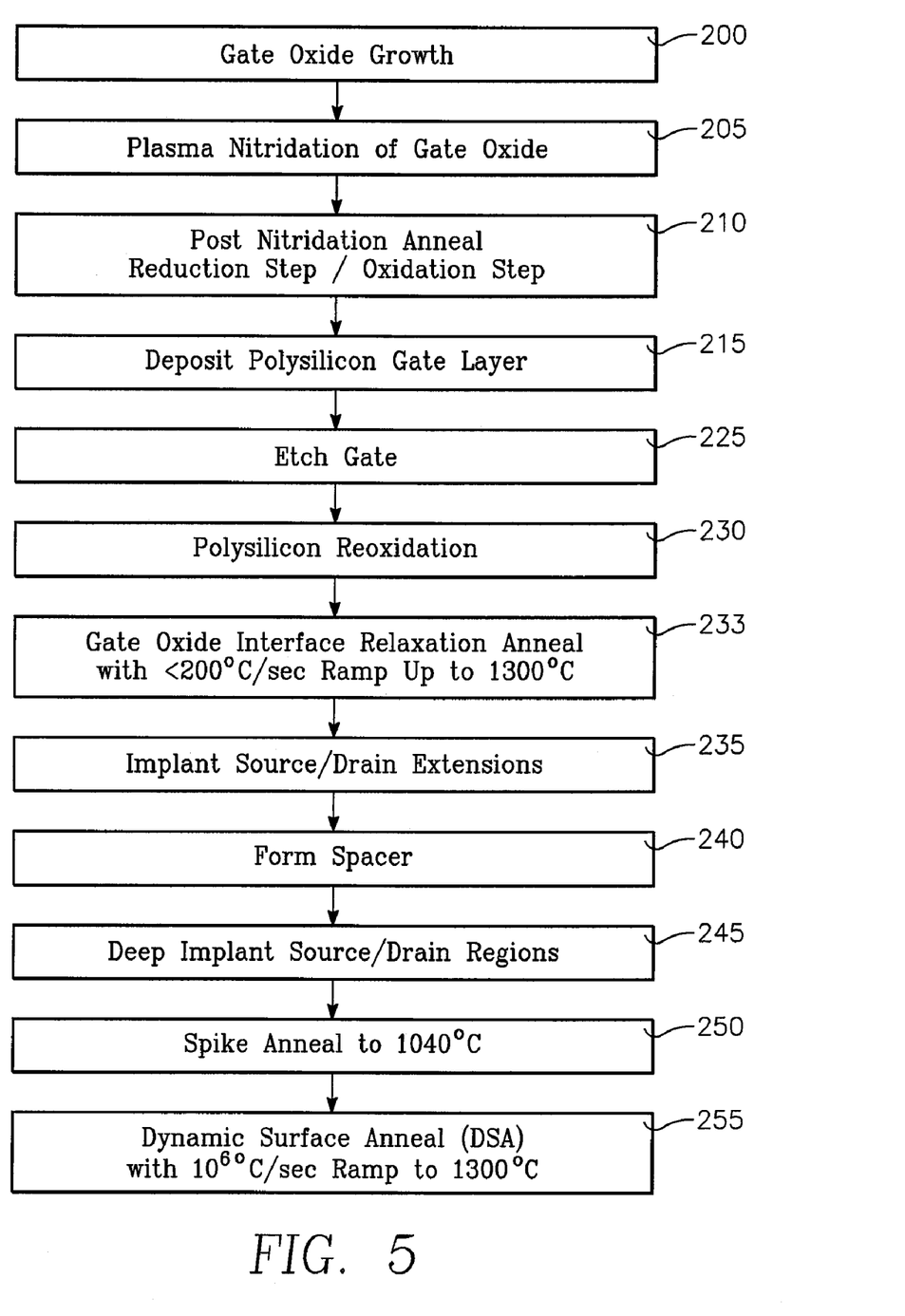
FIG. 5 is a block flow diagram of a process of a second embodiment.

FIG. 5 depicts a process flow sequence of a second embodiment. The process of FIG. 5 is the same as that of FIG. 3 except that the gate dielectric relaxation anneal step is performed after the polysilicon gate reoxidation step. This second embodiment will now be described with reference to both FIG. 5 and FIGS. 4A-4H. The first step in the process of FIG. 5 (block 200) is to expose a crystalline silicon wafer 10 of FIG. 4A to a process gas containing oxygen (e.g., oxygen gas) and thermally oxidize the silicon. Referring to FIG. 4B, the silicon dioxide layer 12 formed by the step of block 100 of FIG. 4A is exposed to a nitrogen-containing plasma to perform nitridation of the oxide layer 10 (block 205 of FIG. 5). About 80% of the nitrogen atoms are bonded in the dielectric material, leaving about 20% unattached. This remainder is bonded and the nitrogen distribution in the gate dielectric 12 is stabilized by a post-nitridation anneal step (block 210 of FIG. 5). Referring to FIGS. 4C and 4D, the post-nitridation step in one implementation may consist of multiple steps, in which the wafer is exposed to an inert atmosphere (FIG. 4C) while being heated to about 1000 degrees C., which can densify the silicon oxynitride gate dielectric 12. In the second of the post nitridation annealing steps, which is depicted in FIG. 4D, the wafer is heated in an oxidizing atmosphere in order to grow silicon dioxide near the boundary 14 between the crystalline silicon 10 and the gate dielectric 12. Such a multiple step post-nitridation anneal process is discussed below in greater detail with reference to the third embodiment.

The next step is to deposit a polysilicon layer 16 shown in FIG. 4E, which is the step of block 215 of FIG. 5.

Gate stack fabrication is then completed by performance of a gate etch step (block 225 of FIG. 5) depicted in FIG. 4F and a polysilicon reoxidation step (block 230 of FIG. 5) depicted in FIG. 4G, in which the gate stack 10, 12, 16 is exposed to an oxidizing atmosphere. Damaged or undercut portions of the gate 16 are consumed by oxidation during this step. Following this step, a pre-implant gate oxide relaxation anneal step is performed (block 233 of FIG. 5). In this step, the wafer temperature is slowly ramped up from a low temperature (e.g., 400 degrees C.) to the silicon melting temperature (1300 degrees C.) and then ramped down to the starting temperature. The ramp rate (both up and down) may be about 75 degrees C. per second, or more generally below about 250 degrees C. per second. The temperature profile during this step follows the portion of the graph of FIG. 2 labeled "preimplant relaxation anneal".

Figure 4H:
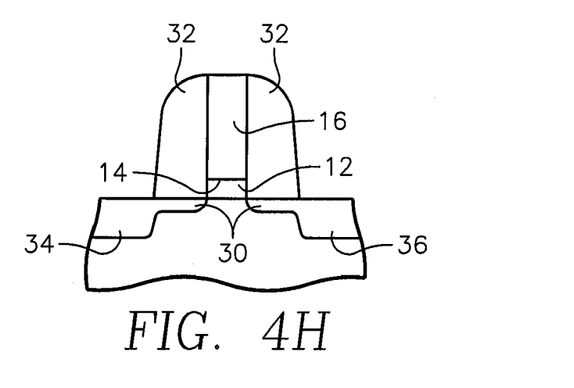

Device fabrication is completed by ion implantation to form the ultra-shallow source-drain extensions 32 of FIG. 4H (block 235 of FIG. 5), formation of the spacer 32 of FIG. 4H (block 240 of FIG. 5), ion implantation to form the deep source and drain regions 34, 36 of FIG. 4H (block 245 of FIG. 5), optional spike anneal (block 250) followed by millisecond laser anneal or dynamic surface anneal (block 255).

Figure 6:
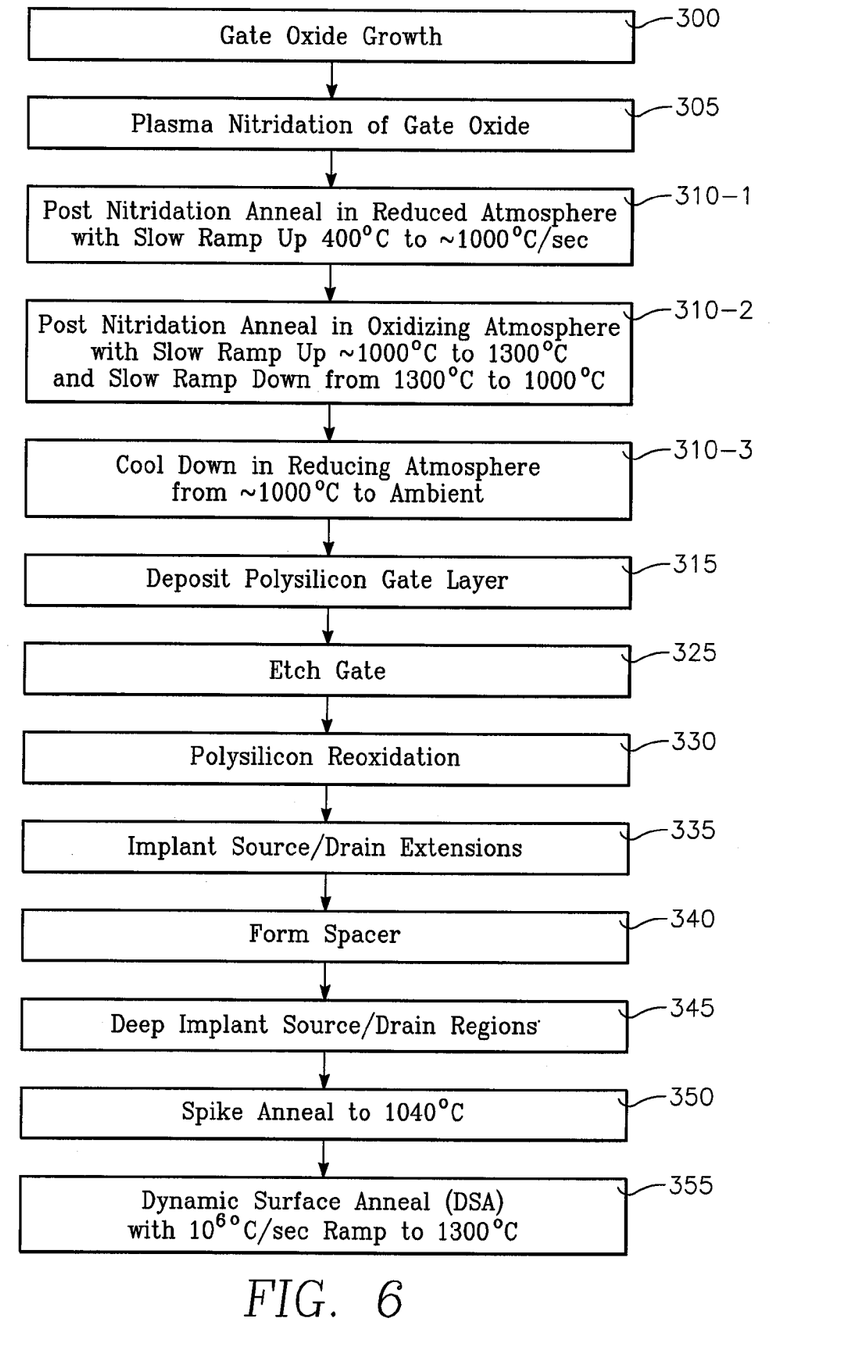
FIG. 6 is a block flow diagram of a process of a third embodiment.

FIG. 6 depicts a process flow sequence of a third embodiment. The process of FIG. 6 is the same as that of FIG. 3 except that the gate dielectric relaxation anneal step is integrated into the post-nitridation anneal step. This third embodiment will now be described with reference to both FIG. 6 and FIGS. 4A-4H. The first step in the process of FIG. 6 (block 300) is to expose a crystalline silicon wafer 10 of FIG. 4A to a process gas containing oxygen (e.g., oxygen gas) and thermally oxidizing the silicon. Referring to FIG. 4B, the silicon dioxide layer 12 formed by the step of block 300 is exposed to a nitrogen-containing plasma to perform nitridation of the oxide layer 10 (block 305 of FIG. 6). About 80% of the nitrogen atoms are bonded in the dielectric material, leaving about 20% unattached. This remainder is bonded and the nitrogen distribution in the gate dielectric 12 is stabilized by a multi-step post-nitridation anneal process (blocks 310-1, 310-2 and 310-3 of FIG. 6).

The post nitridation anneal process of blocks 310-1, 310-2 and 310-3 incorporates the gate dielectric relaxation anneal step. It is related to the post nitridation anneal processes disclosed in U.S. application Ser. No. 011/397,010 entitled "Silicon Oxynitride Gate Dielectric Formation Using Multiple Annealing Steps" filed Apr. 3, 2006 by Christopher S. Olson, and in U.S. application Ser. No. 10/794,707 entitled "Two Step Post Nitridation Annealing for Lower EOT Plasma Nitrided Gate Dielectrics" filed Mar. 4, 2004 by Christopher S. Olsen, both applications assigned to the present assignee, the disclosures of both aforementioned applications being incorporated herein by reference in their entirety.

In the step of block 310-1, depicted in FIG. 4C, the wafer is exposed to a reducing atmosphere while being heated to about 1000 degrees C. The step of block 310-1 can densify the nitrogen distribution near the surface 12a of the silicon oxynitride gate dielectric 12. During this densification step, while the predominant component of the process gas is nitrogen, a small partial pressure of oxygen (on the order of milliTorr) is maintained that is sufficient to minimize etching or sublimation of SiO from the gate dielectric 12, as will be discussed below in greater detail.

In the step of block 310-2 of FIG. 6, which is depicted in FIG. 4D, the wafer is heated in an oxidizing atmosphere (high partial pressure of oxygen in the range of one or more Torr) in order to grow silicon dioxide within the gate dielectric 12 near the gate dielectric-silicon interface 14. During this step, the wafer temperature begins at about 1050 degrees C. and peaks at 1300 degrees C. and then decreases back to 1050 degrees C. Densification of nitrogen near the gate dielectric top surface 12a discourages oxide growth there, and oxide growth tends to occur within the gate dielectric 12 at the gate dielectric-silicon boundary 14. The effect is to further reduce the relative distribution of nitrogen near the boundary 14 and increase it near the top surface 12a of the gate dielectric. Minimizing the nitrogen concentration near the boundary 14 increases carrier mobility in the source-drain channel.

In the step of block 310-3, the atmosphere is changed back to a reducing atmosphere (low partial pressure of oxygen) while the wafer is cooled down from 1050 degrees C. to an initial temperature.

The wafer temperature excursion during the steps of blocks 310-1, 310-2 and 310-3 begins at several hundred degrees C. (at the beginning of the step of block 310-1) and ramps up to reach the peak temperature of 1300 degrees C. (in the middle of the step of block 310-2) and ramps down to reach the starting temperature of several hundred degrees C. (at the end of the step of block 310-3). These changes are not necessarily carried out at a constant rate. Significantly, the temperature ramp-up rates and the temperature ramp down rates during these steps are limited to low rates, below 250 degrees C. per second, and may be limited to as low as 75 degrees C. per second. Therefore, the wafer temperature remains above the silicon oxynitride viscous temperature (1050 degrees C.) for several seconds and the wafer is raised to the same peak temperature that is later reached during the post-implant DSA process. The resulting temperature profile corresponds to that of FIG. 2. As a result, the steps of blocks 310-1, 310-2 and 310-3 include the performance of the gate dielectric relaxation anneal step discussed above with respect to FIG. 2.

Figure 7:
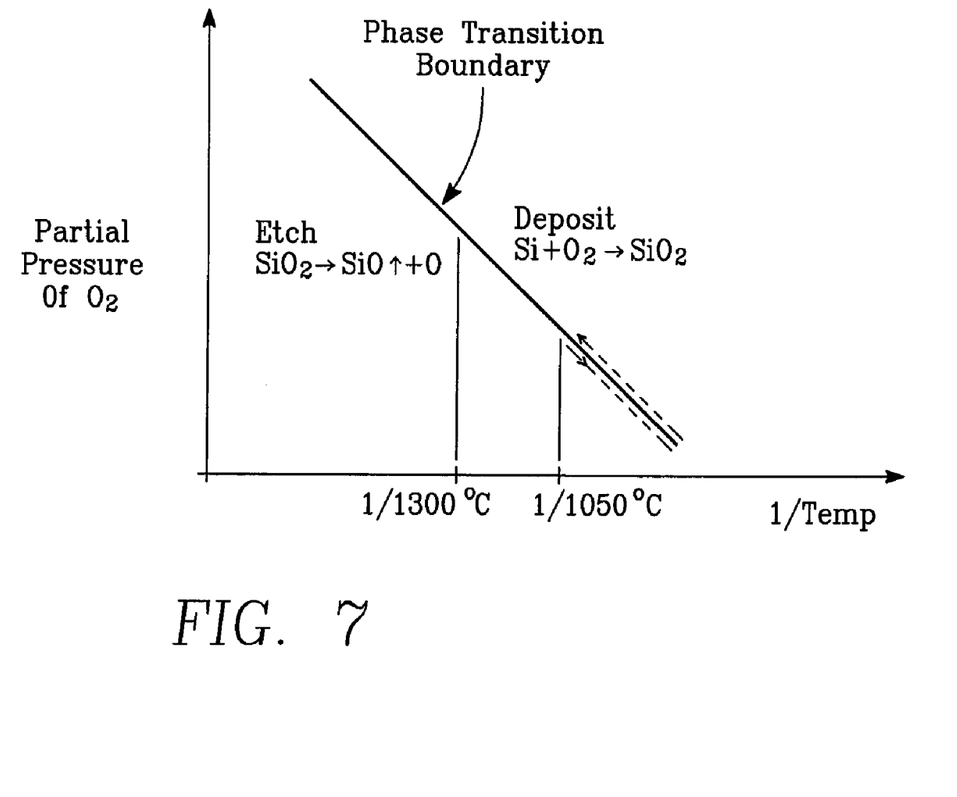
FIG. 7 is a phase diagram of the gate dielectric.

FIG. 7 is a phase diagram of the gate dielectric material, depicting the transition boundary between an etch phase and an oxide deposition phase. The vertical axis corresponds to the partial pressure of oxygen, while the horizontal axis corresponds to the reciprocal of the wafer temperature. The phase transition boundary is the diagonal line labeled "boundary". The etch phase is below and to the left of he boundary line while the deposition phase is above and to the right of the boundary line. The dashed line extending just above the boundary line represents the progress of the step of steps of blocks 310-1, 310-2 and 310-3, in which the oxygen partial pressure is (ideally) maintained at a low level (e.g., in the 100 milliTorr range) that keeps the gate dielectric on or near the phase transition boundary, so that either a negligible oxide growth or deposition rate is maintained or a negligible etch rate is maintained. In this way, there is no uncontrolled oxide growth nor uncontrolled etching. As the wafer temperature increases, the partial pressure of oxygen is increased to maintain the gate dielectric on or near the transition boundary between oxide growth and etching. As will be described below, during the step of block 310-2, while the wafer temperature is above the silicon oxynitride viscous temperature of 1050 degrees C., oxide growth is desired, and therefore the oxygen partial pressure is greatly increased temporarily (e.g., to 1 Torr) to move the system well into the oxidation phase above the transition boundary line of the graph of FIG. 7. During the next step of block 310-3, the system is changed back to be near or at the phase transition boundary by returning the oxygen partial pressure back to the low level in the 100 milliTorr range.

The next step is to deposit a polysilicon layer 16 shown in FIG. 4E, which is the step of block 315 of FIG. 6.

Gate stack fabrication is then completed by performance of a gate etch step (block 325 of FIG. 6) depicted in FIG. 4F and a polysilicon reoxidation step (block 330 of FIG. 6) depicted in FIG. 4G, in which the gate stack 10, 12, 16 is exposed to an oxidizing atmosphere. Damaged or undercut portions of the gate 16 are consumed by oxidation during this step.

Device fabrication is completed by ion implanting the source-drain extensions (block 335 of FIG. 6), spacer formation (block 340 of FIG. 6), source and drain implantation (block 345 of FIG. 6), optional spike anneal (block 350) followed by dynamic surface anneal (block 355). In the dynamic surface anneal step of block 355, a laser beam from an array of lasers is swept across the wafer surface. Each local area of the wafer, about area of the laser beam, is raised to the peak temperature (e.g., 1300 degrees C.) for an extremely short (milliseconds) time at a rapid rate (million degrees C. per second) and is immediately cooled to ambient temperature at an equally rapid rate, as described in the above-referenced patent to Jennings, et al. Because the wafer has previously been raised to the same peak temperature at a slow rate and then cool at the same slow rate by the gate dielectric relaxation anneal process, the defect and fixed charge density in the gate dielectric near the silicon-dielectric boundary is minimal, thereby enhancing carrier mobility in the source-drain channel.

Figure 8:
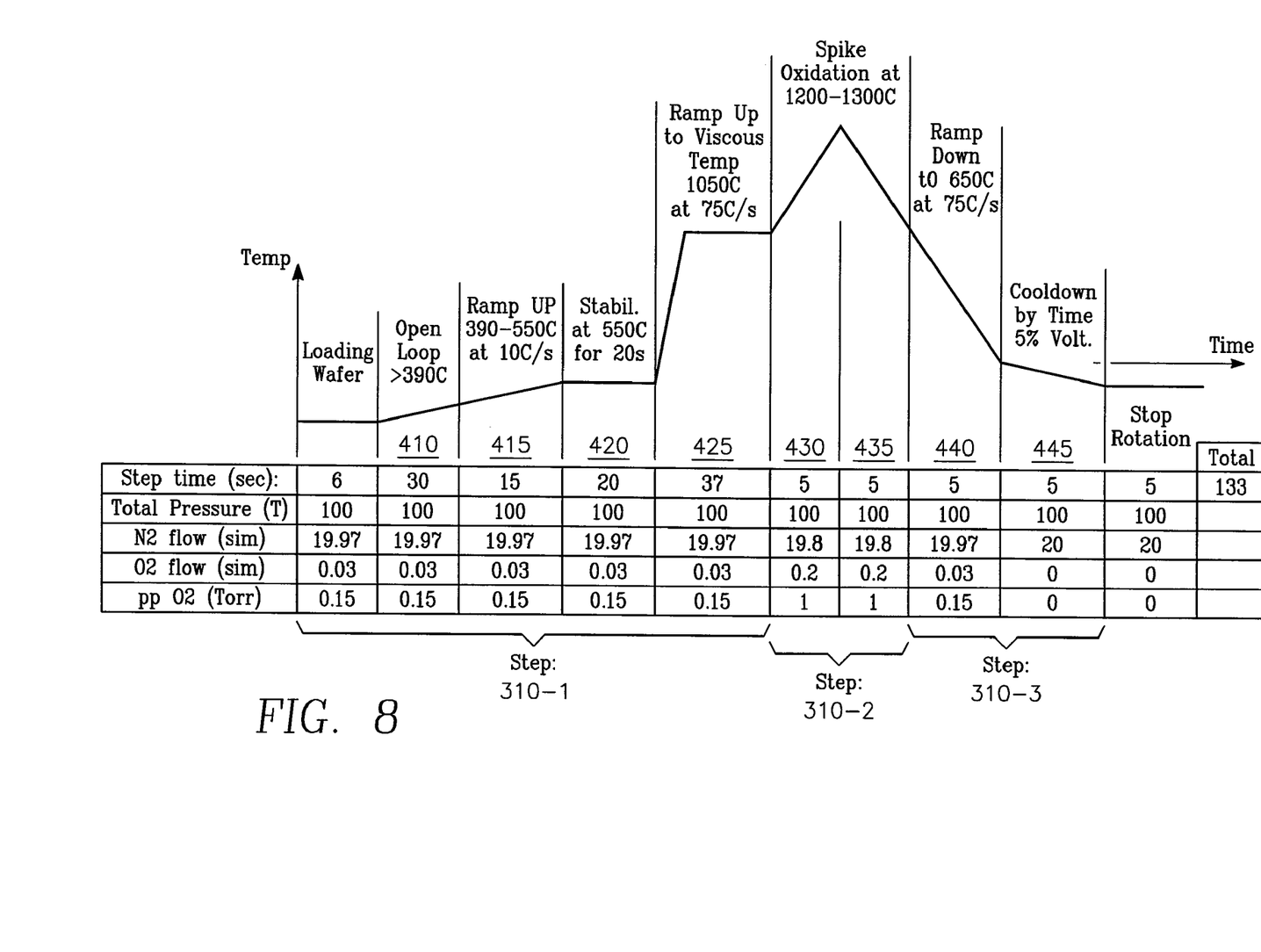
FIG. 8 is a combined chart and graph representing a post-nitridation anneal process in accordance with FIG. 6.

FIG. 8 is a combined chart and graph illustrating the wafer temperature profile and progression of process parameters during one exemplary implementation of the post-nitridation anneal steps of blocks 310-1, 310-2 and 310-3 of FIG. 6. The chart of FIG. 8 divides the entire process of the steps of blocks 310-1, 310-2, 310-3 into eight sections 410, 415, 420, 425, 430, 435, 440, 445. As indicated in the chart of FIG. 8, sections 410-425 constitute the step of block 310-1 of FIG. 6. Sections 430-435 constitute the step of block 310-2 and sections 440-445 constitute the step of block 310-3. During all of these steps, the chamber pressure is maintained at 100 T in the example of FIG. 8.

In section 410 of the chart of FIG. 8, the wafer has been loaded into the reactor chamber, and the wafer temperature increases from ambient to over 390 degrees C. over a time period of about 30 seconds. During this time, the nitrogen gas flow rate into the reactor chamber is 19.97 slm (standard liters per minute), the oxygen flow rate is very low at 0.03 slm to provide a low partial pressure of oxygen of 0.15 Torr. This provides a reducing atmosphere. The small oxygen partial pressure is sufficient to minimize or eliminate SiO sublimation, so that the process is maintained one or near the phase transition boundary of FIG. 7. In section 415, the wafer temperature is ramped up to 550 degrees C. over 15 seconds at a ramp rate of 10 degrees C. per second, with no change in the gas flow rates. In section 420, the temperature is held constant at 550 degrees C. for 20 seconds, with no change in gas flow rates. In section 425, the wafer temperature is ramped up to and then held at the temperature at which silicon dioxide (or silicon oxynitride) becomes viscous, namely 1050 degrees C., over a period of 37 seconds, the ramp rate being 75 degrees per second. No change in gas flow rate is made. This concludes the step of block 310-1 of FIG. 6 that employs a reducing atmosphere dominated by nitrogen gas with a low oxygen partial pressure.

The next step, block 310-2 of FIG. 6, consists of sections 430 and 435 of FIG. 8 and is carried out in an oxidizing atmosphere. In section 430, the wafer temperature is ramped from 1050 degrees C. up to the peak temperature (1300 degrees C.) over 5 seconds at a rate of 75 degrees C. per second. During this time, a high oxygen gas flow rate is maintained, 0.2 slm to provide a high partial pressure of oxygen of about 1 Torr. The nitrogen gas flow rate is decreased to 19.8 slm. In section 435 of FIG. 8, the wafer temperature is ramped down from 1300 degrees C. to 1050 degrees C. at 75 degrees C. per second for 5 seconds, with the gas flow rates unchanged from the previous section. The oxidizing atmosphere and high temperature of sections 430 and 435 of FIG. 8, coupled with the gradual temperature ramp rates, causes a high quality oxide to be grown in the gate dielectric layer at the dielectric-silicon boundary while at the same time defects in the gate dielectric are cured by silicon dioxide (silicon oxynitride) viscous reflowing during the seconds in which the wafer is above the silicon dioxide viscous temperature (1050 degrees C.). This concludes the oxidizing step of block 310-2 of FIG. 6.

The sections of 440 and 445 of FIG. 8 constitute the step of block 310-3 of FIG. 6. In this step, the reactor atmosphere is changed from an oxidizing one to a relatively inert one by a reduction in the oxygen gas flow rate to 0.03 slm and an increase in nitrogen gas flow rate to 19.97 slm, so that the oxygen partial pressure is reduced to 0.15 T. In section 440 of FIG. 8, the wafer temperature is ramped down from 1050 degrees C. to 650 degrees C. over 5 seconds at a rate of 75 degrees C. per second. In section 445 of FIG. 8, the oxygen gas flow is stopped while the nitrogen gas flow is raised to 20 slm, and the wafer is cooled down from 650 degrees C. to an ambient temperature in 5 seconds.

While the foregoing is directed to embodiments of the invention, other and further embodiments of the invention may be devised without departing from the basic scope thereof, and the scope thereof is determined by the claims that follow.

What is claimed is:

1. A method of making a transistor on a semiconductor substrate, comprising:
   forming a gate dielectric on said semiconductor substrate;
   forming a gate electrode on the gate dielectric;
   ion implanting dopant impurities into said semiconductor substrate to form source and drain regions including ultra-shallow source and drain extensions;
   performing millisecond laser annealing by scanning a laser-generated light beam across said semiconductor substrate so as to raise each region illuminated by said light beam to a peak temperature at or near a melting temperature of material of said semiconductor substrate; and
   prior to said ion implanting dopant impurities to form said source and drain regions, raising the temperature of said semiconductor substrate from an ambient temperature to said peak temperature of said millisecond laser annealing at a first rate and decreasing the temperature of said semiconductor substrate from said peak temperature to an ambient temperature at a second rate, said first and second rates being less than 250 degrees C. per second.

2. The method of making a transistor on a semiconductor substrate according to claim 1 wherein said first and second rates are sufficiently small to maintain said gate dielectric above a reflow temperature of said gate dielectric for a duration of more than 5 seconds.

3. The method of making a transistor on a semiconductor substrate according to claim 2 wherein said duration is more than 6 seconds.

4. The method of making a transistor on a semiconductor substrate according to claim 2 wherein said duration is sufficiently long for reflow of the material of said gate dielectric to remove defects in said gate dielectric near a dielectric-substrate interface.

5. The method of making a transistor on a semiconductor substrate according to claim 1 wherein said first and second rates are on the order of 75 degrees C. per second.

6. The method of making a transistor on a semiconductor substrate according to claim 1 wherein said raising the temperature of said substrate from an ambient temperature to said peak temperature of said millisecond laser annealing is performed after said forming a gate electrode.

7. The method of making a transistor on a semiconductor substrate according to claim 1 further comprising performing a polysilicon gate reoxidation step after said forming a gate electrode, and wherein said raising the temperature of said substrate from an ambient temperature to said peak temperature of said millisecond laser annealing is performed after said gate reoxidation step.

8. The method of making a transistor on a semiconductor substrate according to claim 1 further comprising:
performing a gate nitridation step after formation of said gate electrode;
performing a post-nitridation annealing step after said gate nitridation step; and
wherein said raising the temperature of said substrate from an ambient temperature to said peak temperature of said millisecond laser annealing is performed during said post-nitridation annealing step.

9. The method of making a transistor on a semiconductor substrate according to claim 8 wherein said post-nitridation annealing step comprises:
raising the wafer temperature from an ambient temperature to a reflow temperature of said gate dielectric at a ramp rate less than 250 degrees C. per second in a nitrogen-containing atmosphere having a sufficiently low oxygen partial pressure to avoid oxidation; and
raising the wafer temperature from said reflow temperature of said gate dielectric to a melting temperature of said semiconductor substrate at a ramp rate less than 250 degrees C. per second in a nitrogen-containing atmosphere having a sufficiently high oxygen partial pressure to promote oxidation.

10. The method of making a transistor on a semiconductor substrate according to claim 9 wherein said post-nitridation annealing step further comprises:
reducing the wafer temperature from melting temperature of said substrate to said reflow temperature of said gate dielectric at a ramp rate less than 250 degrees C. per second in a nitrogen-containing atmosphere having a sufficiently high oxygen partial pressure to promote oxidation; and
reducing the wafer temperature from a reflow temperature of said gate dielectric to an ambient temperature at a ramp rate less than 250 degrees C. per second in a nitrogen-containing atmosphere having a sufficiently low oxygen partial pressure to avoid oxidation.

11. A method of making a transistor on a semiconductor substrate, comprising:
forming a gate dielectric on said semiconductor substrate;
forming a gate electrode on the gate dielectric;
ion implanting dopant impurities into said semiconductor substrate to form source and drain regions including ultra-shallow source and drain extensions;
performing millisecond laser annealing by scanning a laser-generated light beam across said semiconductor substrate so as to raise each region illuminated by said light beam to a peak temperature at or near a melting temperature of material of said semiconductor substrate; and
prior to said ion implanting dopant impurities to form said source and drain regions, holding the temperature of said semiconductor substrate above a reflow temperature of said gate dielectric over a duration of more than several seconds, while ramping said wafer temperature up to and then down from a melting temperature of said semiconductor substrate at ramp rates of less than 250 degrees C. per second.

12. The method of making a transistor on a semiconductor substrate according to claim 11 wherein said reflow temperature of said gate dielectric is about 1050 degrees C. and said melting temperature of said semiconductor substrate is about 1300 degrees C.

13. The method of making a transistor on a semiconductor substrate according to claim 11 wherein said duration is more than 6 seconds.

14. The method of making a transistor on a semiconductor substrate according to claim 11 wherein said duration is sufficiently long for reflow of the material of said gate dielectric to remove defects in said gate dielectric near a dielectric-substrate interface.

15. The method of making a transistor on a semiconductor substrate according to claim 1 wherein said ramp rates are on the order of 75 degrees C. per second.

16. The method of making a transistor on a semiconductor substrate according to claim 11 wherein said raising the temperature of said substrate from an ambient temperature to said peak temperature of said millisecond laser annealing is performed after said forming a gate electrode.

17. The method of making a transistor on a semiconductor substrate according to claim 11 further comprising performing a polysilicon gate reoxidation step after said forming a gate electrode, and wherein said raising the temperature of said substrate from an ambient temperature to said peak temperature of said millisecond laser annealing is performed after said gate reoxidation step.

18. The method of making a transistor on a semiconductor substrate according to claim 11 further comprising:
performing a gate nitridation step after formation of said gate electrode;
performing a post-nitridation annealing step after said gate nitridation step; and
wherein said raising the temperature of said substrate from an ambient temperature to said peak temperature of said millisecond laser annealing is performed during said post-nitridation annealing step.

19. The method of making a transistor on a semiconductor substrate according to claim 18 wherein said post-nitridation annealing step comprises:
raising the wafer temperature from an ambient temperature to a reflow temperature of said gate dielectric at a ramp rate less than 250 degrees C. per second in a nitrogen-containing atmosphere having a sufficiently low oxygen partial pressure to avoid oxidation; and raising the wafer temperature from said reflow temperature of said gate dielectric to a melting temperature of said semiconductor substrate at a ramp rate less than 250 degrees C. per second in a nitrogen-containing atmosphere having a sufficiently high oxygen partial pressure to promote oxidation.

20. The method of making a transistor on a semiconductor substrate according to claim 19 wherein said post-nitridation annealing step further comprises:

reducing the wafer temperature from melting temperature of said substrate to said reflow temperature of said gate dielectric at a ramp rate less than 250 degrees C. per second in a nitrogen-containing atmosphere having a sufficiently high oxygen partial pressure to promote oxidation;

reducing the wafer temperature from a reflow temperature of said gate dielectric to an ambient temperature at a ramp rate less than 250 degrees C. per second in a nitrogen-containing atmosphere having a sufficiently low oxygen partial pressure to avoid oxidation.

* * * * *